US010636682B2

United States Patent
Kikumoto et al.

(10) Patent No.: US 10,636,682 B2
(45) Date of Patent: Apr. 28, 2020

(54) SUBSTRATE PROCESSING APPARATUS

(71) Applicant: SCREEN Holdings Co., Ltd., Kyoto (JP)

(72) Inventors: Noriyuki Kikumoto, Kyoto (JP); Masahiro Kimura, Kyoto (JP); Shuichi Yasuda, Kyoto (JP); Kazuhiro Fujita, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 475 days.

(21) Appl. No.: 15/449,188

(22) Filed: Mar. 3, 2017

(65) Prior Publication Data
US 2017/0271177 A1    Sep. 21, 2017

(30) Foreign Application Priority Data

Mar. 18, 2016  (JP) ................................. 2016-054965

(51) Int. Cl.
*H01L 21/67* (2006.01)
*B08B 3/08* (2006.01)
*B08B 3/10* (2006.01)
*B08B 15/00* (2006.01)
*H01L 21/02* (2006.01)

(52) U.S. Cl.
CPC .......... *H01L 21/67023* (2013.01); *B08B 3/08* (2013.01); *B08B 3/10* (2013.01);
(Continued)

(58) Field of Classification Search
None
See application file for complete search history.

(56) References Cited

U.S. PATENT DOCUMENTS

| 6,228,561 | B1 | 5/2001 | Hasebe et al. | 430/311 |
| 2003/0172955 | A1 | 9/2003 | Kuroda et al. | 134/2 |

(Continued)

FOREIGN PATENT DOCUMENTS

| JP | H11-87294 A | 3/1999 |
| JP | H11-102884 A | 4/1999 |

(Continued)

OTHER PUBLICATIONS

Office Action dated Aug. 22, 2019 in corresponding Japanese Patent Application No. 2016-054965.

*Primary Examiner* — Michael E Barr
*Assistant Examiner* — Jason P Riggleman
(74) *Attorney, Agent, or Firm* — Ostrolenk Faber LLP

(57) ABSTRACT

In a substrate processing apparatus, the inner peripheral edge of a second-cup canopy part radially opposes an outer peripheral surface of an opposing-member side wall part. This suppresses dispersion of processing liquids to above a cup part. A second-cup gap distance that is a radial distance between the outer peripheral surface of the opposing-member side wall part and the inner peripheral edge of the second-cup canopy part is greater than a holder gap distance that is a radial distance between the inner peripheral surface of the opposing-member side wall part and the outer peripheral surface of the substrate holder. This prevents or suppresses the possibility that, when a second processing liquid dispersed from a substrate is received by a second cup, the second processing liquid may be pushed downward by a downward airflow. Accordingly, a plurality of types of processing liquids will be separately received by a plurality of cups.

19 Claims, 8 Drawing Sheets

(52) U.S. Cl.
CPC ...... *B08B 15/007* (2013.01); *H01L 21/67051* (2013.01); *B08B 2203/0229* (2013.01); *H01L 21/0206* (2013.01)

(56) References Cited

U.S. PATENT DOCUMENTS

| | | | |
|---|---|---|---|
| 2012/0298147 A1 | 11/2012 | Kaneko | 134/30 |
| 2014/0060423 A1 | 3/2014 | Nakai et al. | 118/50 |
| 2014/0227883 A1 | 8/2014 | Izumoto et al. | 438/745 |
| 2014/0273498 A1 | 9/2014 | Kobayashi et al. | 438/745 |
| 2014/0290703 A1 | 10/2014 | Kobayashi et al. | 134/33 |
| 2015/0234296 A1* | 8/2015 | Yagi | H01L 21/67063 355/72 |
| 2016/0329220 A1 | 11/2016 | Nakai | |

FOREIGN PATENT DOCUMENTS

| | | | |
|---|---|---|---|
| JP | 2004-241433 A | * | 8/2004 |
| JP | 2012-244129 A | | 12/2012 |
| JP | 2014-67778 A | | 4/2014 |
| JP | 2014-67780 A | | 4/2014 |
| JP | 2014-154858 A | | 8/2014 |
| JP | 2014-157901 A | | 8/2014 |
| JP | 2014-179489 A | | 9/2014 |
| JP | 2014-179490 A | | 9/2014 |
| JP | 2014-194965 A | | 10/2014 |
| JP | 2015-153947 A | | 8/2015 |
| JP | 2015-156473 A | | 8/2015 |
| JP | 2016-063049 A | | 4/2016 |
| TW | 324834 B | | 1/1998 |
| TW | 200302519 A | | 8/2003 |

\* cited by examiner

SUBSTRATE PROCESSING APPARATUS

TECHNICAL FIELD

The present invention relates to a substrate processing apparatus for processing substrates.

BACKGROUND ART

A process of manufacturing semiconductor substrates (hereinafter, simply referred to as "substrates") conventionally involves various types of processing that is performed on substrates. For example, chemical solution processing such as etching is performed on a surface of a substrate having a resist pattern on the surface thereof, by supplying a chemical solution to the substrate. After the chemical solution processing has ended, cleaning processing is performed by supplying a cleaning liquid to the substrate, and then dry processing is performed on the substrate.

For example, Japanese Patent Application Laid-Open No. 2015-153947 (Document 1) proposes a substrate processing apparatus for processing substrates in an atmosphere where the oxygen concentration is low. The substrate processing apparatus includes a spin chunk that holds and rotates a substrate, a shielding member that is disposed over the substrate, and a cup that surrounds a spin base of the spin chunk. The shielding member has an opposed surface disposed over the substrate and an inner peripheral surface surrounding the substrate. The lower end of the inner peripheral surface of the shielding member is disposed in the periphery of the spin base.

The space between the upper surface of the substrate and the opposed surface of the shielding member is filled with an inert gas that is discharged from a discharge port of the shielding member. This reduces the oxygen concentration in an atmosphere that is in contact with the upper and outer peripheral surfaces of the substrate. The inert gas in the space between the substrate and the shielding member is drawn through the cup by suction by an exhaust unit provided at the bottom of the cup, flows into the cup from between the lower end of the inner peripheral surface of the shielding member and the outer peripheral surface of the spin base, and is exhausted to the outside of the cup.

In the substrate processing apparatus of Document 1, the distance in the radial direction between the cup upper end portion and the shielding member is less than the distance in the radial direction between the lower end of the inner peripheral surface of the shielding member and the outer peripheral surface of the spin base. By making small the ring-shaped clearance between the cup upper end portion and the shielding member in this way, it is possible to suppress the possibility that processing liquids dispersed from a rotating substrate into the cup may be dispersed through this clearance into the space above the cup.

Now, in the case where a plurality of types of processing liquids are sequentially supplied to a substrate and used to process the substrate, substrate processing apparatuses may separately recover or discard the processing liquids depending on the type of processing liquid. In this case, a plurality of cups may be disposed one inside another in the radial direction around the substrate, and the cups for receiving a processing liquid dispersed from the substrate may be switched by moving some of the cups in the up-down direction. For example, when a processing liquid is received by a radially outer cup, radially inward cups may be moved downward to place the radially outer cup around the substrate.

A case is assumed in which the substrate processing apparatus of Document 1 includes a plurality of cups and separate the aforementioned plurality of types of processing liquids. If a processing liquid is received by a radially outer cup, the small clearance between the cup upper end portion and the shielding member may increase the velocity of downflow of a gas that flows from the space over the cup into the cup through the clearance, and the processing liquid dispersed from the substrate into the cup may be caused to flow downward by the downflow of the gas. Consequently, the processing liquid that is supposed to be received by the radially outer cup may flow into a radially inner cup placed below the radially outer cup.

SUMMARY OF INVENTION

The present invention is intended for a substrate processing apparatus for processing substrates, and it is an object of the present invention to separately receive a plurality of types of processing liquids by a plurality of cups while suppressing dispersion of the processing liquids into the space above a cup part.

The substrate processing apparatus according to the present invention includes a substrate holder of a disk-like shape having an outer diameter larger than an outer diameter of a substrate, disposed below the substrate, and for holding the substrate in a horizontal position, a substrate rotation mechanism for rotating the substrate holder about a central axis pointing in an up-down direction, an opposing member that opposes an upper surface of the substrate, a processing-liquid supply part for supplying a processing liquid to the upper surface of the substrate, a gas supply part for supplying a treatment atmospheric gas to a processing space that is a space between a lower surface of the opposing member and the upper surface of the substrate, a cup part disposed around the substrate holder and for receiving the processing liquid from the substrate, and a gas discharge part for discharging a gas in the cup part to an outside of the cup part by suction. The processing-liquid supply part includes a first processing-liquid supply part for supplying a first processing liquid to the substrate, and a second processing-liquid supply part for supplying a second processing liquid to the substrate. The opposing member includes an opposing-member canopy part that opposes the upper surface of the substrate, and an opposing-member side wall part that extends downward from an outer peripheral portion of the opposing-member canopy part, and has an outer peripheral surface of a cylindrical shape and an inner peripheral surface that opposes an outer peripheral surface of the substrate holder in a radial direction. The cup part includes a first cup having a first-cup side wall part of a cylindrical shape and a first-cup canopy part of a circular ring plate-like shape and for receiving the first processing liquid from the substrate, the first-cup canopy part extending radially inward from an upper edge of the first-cup side wall part, and a second cup having a second-cup side wall part of a cylindrical shape and a second-cup canopy part of a circular ring plate-like shape, disposed radially outward of the first cup, and for receiving the second processing liquid from the substrate, the second-cup canopy part extending radially inward from an upper edge of the second-cup side wall part and having an inner peripheral edge that opposes the outer peripheral surface of the opposing-member side wall part in the radial direction, and a cup moving mechanism for moving the first cup relative to the substrate holder in the up-down direction. The first processing liquid supplied to the upper surface of the substrate that is being rotated is received by the first cup while the first cup is at a first processing position at which an inner peripheral edge of the first-cup canopy part opposes the outer peripheral surface of the opposing-member side wall part in the radial direction. The second processing liquid supplied to the upper surface of the substrate that is being rotated is received by the second cup while the first cup is at a second processing position at which the inner peripheral edge of the first-cup canopy part is located below a lower end of the opposing-member side wall part. A second-cup gap distance that is a distance in the radial direction between the outer peripheral surface of the opposing-member side wall part and the inner peripheral edge of the second-cup canopy part is greater than a holder gap distance that is a distance in the radial direction between the inner peripheral surface of the opposing-member side wall part and the outer peripheral surface of the substrate holder. The substrate processing apparatus can separately receive a plurality of types of processing liquids by a plurality of cups while suppressing dispersion of the processing liquids into the space above the cup part.

In a preferred embodiment of the present invention, a lower surface of the second-cup canopy part includes an inclined surface that is inclined downward outwardly in the radial direction from the inner peripheral edge of the second-cup canopy part.

In another preferred embodiment of the present invention, the opposing-member canopy part has an opposing-member opening in a central portion thereof, the first processing liquid and the second processing liquid from the processing-liquid supply part are supplied through the opposing-member opening to the upper surface of the substrate, and a first-cup gap distance that is a distance in the radial direction between the outer peripheral surface of the opposing-member side wall part and the inner peripheral edge of the first-cup canopy part is greater than the holder gap distance.

In yet another preferred embodiment of the present invention, a lower surface of the first-cup canopy part includes an inclined surface that is inclined downward outwardly in the radial direction from the inner peripheral edge of the first-cup canopy part.

In yet another preferred embodiment of the present invention, the opposing member rotates about the central axis when the substrate holder rotates.

Preferably, the opposing member is held by the substrate holder and rotated along with the substrate holder by the substrate rotation mechanism.

In yet another preferred embodiment of the present invention, the lower end of the opposing-member side wall part is located below an upper end of the outer peripheral surface of the substrate holder.

In yet another preferred embodiment of the present invention, the first processing liquid or the second processing liquid is a cleaning liquid that is supplied to the upper surface of the substrate at a processing temperature higher than normal temperature to perform cleaning processing on the substrate, dry processing for removing a liquid from a surface of the substrate by rotating the substrate via the substrate rotation mechanism is performed after the cleaning processing ends, and processing for cooling the substrate by supplying a processing liquid having a temperature lower than the processing temperature to the upper surface of the substrate is performed between the cleaning processing and the dry processing.

These and other objects, features, aspects and advantages of the present invention will become more apparent from the following detailed description of the present invention when taken in conjunction with the accompanying drawings.

DESCRIPTION OF EMBODIMENTS

Figure 1:
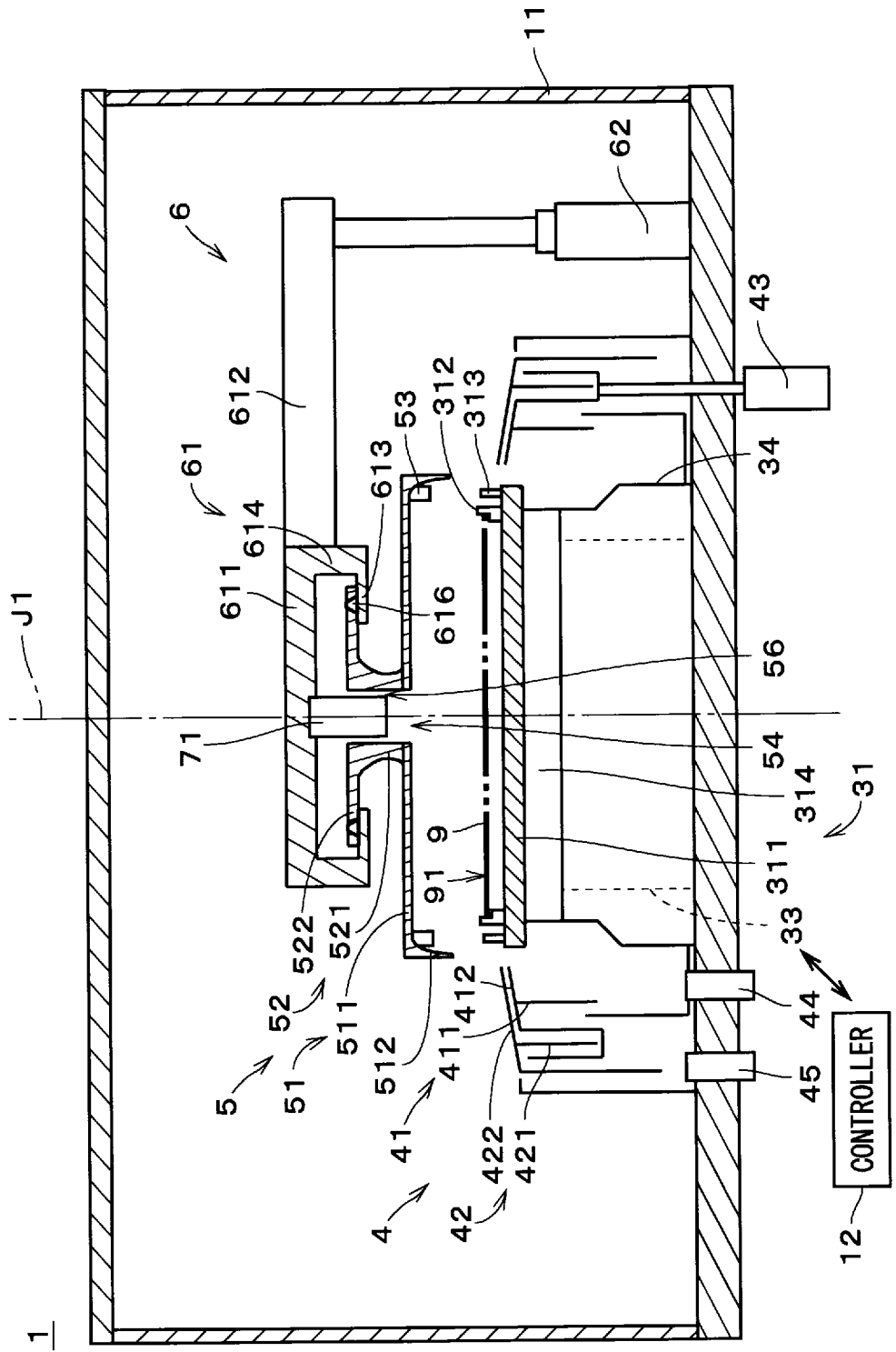
FIG. 1 is a cross-sectional view of a substrate processing apparatus according to an embodiment.

FIG. 1 is a cross-sectional view illustrating a configuration of a substrate processing apparatus 1 according to an embodiment of the present invention. The substrate processing apparatus 1 is a single wafer processing apparatus for processing semiconductor substrates 9 (hereinafter, simply referred to as "substrates 9") one at a time. The substrate processing apparatus 1 includes a substrate holder 31, a substrate rotation mechanism 33, a cup part 4, a top plate 5, an opposing-member moving mechanism 6, and a processing liquid nozzle 71. The constituent elements of the substrate processing apparatus 1 are housed inside a housing 11. The substrate processing apparatus 1 further includes a controller 12 that controls consistent elements such as the substrate rotation mechanism 33. The controller 12 is not shown in FIG. 2 onward.

The substrate holder 31 holds a substrate 9 in a horizontal position. The substrate holder 31 includes a holder base 311, a plurality of chucks 312, a plurality of engagement parts 313, and a base supporter 314. The holder base 311 is a generally disk-like member about a central axis J1 pointing in the up-down direction. The holder base 311 is made of, for example, a fluorocarbon resin with relatively high chemical resistance. The substrate 9 is spaced above the holder base 311. In other words, the holder base 311 of the substrate holder 31 is disposed below the substrate 9. The outer diameter of the substrate holder 31 is larger than the outer diameter of the substrate 9. The holder base 311 extends radially outward of the substrate 9 along the entire circumference thereof about the central axis J1.

The base supporter 314 is a generally disk-like member about the central axis J1. The holder base 311 is disposed above the base supporter 314 and supported from the underside by the base supporter 314. The outer diameter of the holder base 311 is larger than the outer diameter of the base supporter 314. The holder base 311 extends radially outward of the base supporter 314 along the entire circumference thereof about the central axis J1.

The plurality of chucks 312 are circumferentially arranged at approximately equiangular intervals about the central axis J1 on the outer peripheral portion of the upper surface of the holder base 311. In the substrate holder 31, the chucks 312 support the outer edge of the substrate 9. The plurality of engagement parts 313 are circumferentially arranged at approximately equiangular intervals about the central axis J1 on the outer peripheral portion of the upper surface of the holder base 311. The engagement parts 313 are disposed radially outward of the chucks 312.

The substrate rotation mechanism 33 is housed inside a rotation-mechanism housing part 34. The substrate rotation mechanism 33 and the rotation-mechanism housing part 34 are disposed blow the substrate holder 31. The substrate rotation mechanism 33 rotates the substrate 9 along with the substrate holder 31 about the central axis J1.

The cup part 4 is a ring-shaped member about the central axis J1 and disposed radially outward of the substrate 9 and the substrate holder 31. The cup part 4 is disposed around the entire circumferences of the substrate 9 and the substrate holder 31 and receives liquids such as a processing liquid dispersed from the substrate 9 toward the surroundings. The cup part 4 includes a first cup 41, a second cup 42, a cup moving mechanism 43, a first discharge port 44, and a second discharge port 45. The second cup 42 is disposed radially outward of the first cup 41.

The first cup 41 has a first-cup side wall part 411 and a first-cup canopy part 412. The first-cup side wall part 411 has a generally cylindrical shape about the central axis J1. The first-cup canopy part 412 has a generally circular ring plate-like shape about the central axis J1 and extends radially inward from the upper edge of the first-cup side wall part 411. The second cup 42 has a second-cup side wall part 421 and a second-cup canopy part 422. The second-cup side wall part 421 has a generally cylindrical shape about the central axis J1 and is located radially outward of the first-cup side wall part 411. The second-cup canopy part 422 has a generally circular ring plate-like shape about the central axis J1 and extends radially inward from the upper edge of the second-cup side wall part 421 above the first-cup canopy part 412.

The inner diameters of the first-cup canopy part 412 and the second-cup canopy part 422 are slightly larger than the outer diameters of the holder base 311 of the substrate holder 31 and the top plate 5. The lower surface of the first-cup canopy part 412 includes an inclined surface that is inclined downward outwardly in the radial direction from the inner peripheral edge of the first-cup canopy part 412. The lower surface of the second-cup canopy part 422 also includes an inclined surface that is inclined downward outwardly in the radial direction from the inner peripheral edge of the second-cup canopy part 422. In the example illustrated in FIG. 1, approximately the entire lower surface of the first-cup canopy part 412 is an inclined surface that is inclined downward outwardly in the radial direction from the inner peripheral edge. Approximately the entire lower surface of the second-cup canopy part 422 is also an inclined surface that is inclined downward outwardly in the radiation direction from the inner peripheral edge. Similarly, the upper surfaces of the first-cup canopy part 412 and the second-cup canopy part 422 are also inclined surfaces that are inclined downward outwardly in the radial direction from the inner peripheral edges.

The cup moving mechanism 43 switches a cup for receiving liquids such as a processing liquid from the substrate 9 between the first cup 41 and the second cup 42, by moving the first cup 41 in the up-down direction. In other words, the cup moving mechanism 43 is a cup switching mechanism for switching the cup for receiving liquids such as a processing liquid from the substrate 9 by moving the first cup 41 relative to the substrate holder 31 and the second cup 42 in the up-down direction. In the cup part 4, for example, the positions in the up-down direction of the substrate holder 31 and the second cup 42 are fixed, and in the case of switching the cup for receiving liquids such as processing liquids, the first cup 41 is moved relative to the second cup 42 in the up-down direction.

The liquids such as processing liquids received by the first cup 41 are discharged through the first discharge port 44 provided at the bottom of the first cup 41 to the outside of the housing 11. The gas in the first cup 41 is also exhausted through the first discharge port 44 to the outside of the housing 11. The liquids such as processing liquids received by the second cup 42 are discharged through the second discharge port 45 provided at the bottom of the second cup 42 to the outside of the housing 11. The gas in the second cup 42 is also exhausted through the second discharge port 45 to the outside of the housing 11.

The top plate 5 is a generally circular member in a plan view. The top plate 5 is an opposing member that opposes the upper surface 91 of the substrate 9 and serves as a shielding plate that shields the top of the substrate 9. The outer diameter of the top plate 5 is larger than the outer diameters of the substrate 9 and the holder base 311. The top plate 5 includes an opposing-member main body 51, a held part 52, and a plurality of engagement parts 53. The opposing-member main body 51 is made of, for example, a fluorocarbon resin with relatively high chemical resistance. The opposing-member main body 51 includes an opposing-member canopy part 511 and an opposing-member side wall part 512. The opposing-member canopy part 511 opposes the upper surface 91 of the substrate 9. The opposing-member canopy part 511 is, for example, a generally circular ring plate-like member about the central axis J1. The lower surface of the opposing-member canopy part 511 is a flat surface that opposes the upper surface 91 of the substrate 9.

In the example illustrated in FIG. 1, the opposing-member canopy part 511 has an opposing-member opening 54 in a central portion thereof in the radial direction (hereinafter, also simply referred to as the "central portion"). The opposing-member opening 54 has, for example, a generally circular shape in a plan view. The diameter of the opposing-member opening 54 is sufficiently smaller than the diameter of the substrate 9. The opposing-member canopy part 511 has a generally circular ring plate-like shape having the opposing-member opening 54 in the central portion thereof. The opposing-member side wall part 512 extends downward from the outer peripheral portion of the opposing-member canopy part 511. The opposing-member side wall part 512 is, for example, a generally cylindrical member about the central axis J1. The outer peripheral surface of the opposing-member side wall part 512 is a generally cylindrical surface about the central axis J1.

The plurality of engagement parts 53 are circumferentially arranged at approximately equiangular intervals about the central axis J1 on the outer peripheral portion of the lower surface of the opposing-member canopy part 511. The engagement parts 53 are disposed radially inward of the opposing-member side wall part 512.

The held part 52 is connected to the upper surface of the opposing-member main body 51. The held part 52 has an opposing-member cylindrical part 521 and an opposing-member flange part 522. The opposing-member cylindrical part 521 is a generally cylindrical portion that protrudes upward from the circumference of the opposing-member opening 54 of the opposing-member main body 51. The opposing-member cylindrical part 521 has, for example, a generally cylindrical shape about the central axis J1. The opposing-member flange part 522 annularly extends outward in the radial direction from the upper edge of the opposing-member cylindrical part 521. The opposing-member flange part 522 has, for example, a generally circular ring plate-like shape about the central axis J1.

The opposing-member moving mechanism 6 includes an opposing-member holder 61 and an opposing-member elevating mechanism 62. The opposing-member holder 61 holds the held part 52 of the top plate 5. The opposing-member holder 61 includes a holder main body 611, a main body supporter 612, a flange supporter 613, and a supporter connector 614. The holder main body 611 has, for example, a generally disk-like shape about the central axis J1. The holder main body 611 covers the top of the opposing-member flange part 522 of the top plate 5. The main body supporter 612 is a rod-like arm extending approximately in a horizontal direction. One end of the main body supporter 612 is connected to the holder main body 611, and the other end thereof is connected to the opposing-member elevating mechanism 62.

The processing liquid nozzle 71 protrudes downward from the central portion of the holder main body 611. The processing liquid nozzle 71 is inserted without contact in the opposing-member cylindrical part 521. In the following description, the space between the processing liquid nozzle 71 and the opposing-member cylindrical part 521 is referred to as a "nozzle gap 56."

The flange supporter 613 has, for example, a generally circular ring plate-like shape about the central axis J1. The flange supporter 613 is located below the opposing-member flange part 522. The inner diameter of the flange supporter 613 is smaller than the outer diameter of the opposing-member flange part 522 of the top plate 5. The outer diameter of the flange supporter 613 is larger than the outer diameter of the opposing-member flange part 522 of the top plate 5. The supporter connector 614 has, for example, a generally cylindrical shape about the central axis J1. The supporter connector 614 connects the flange supporter 613 and the holder main body 611 around the opposing-member flange part 522. In the opposing-member holder 61, the holder main body 611 corresponds to a holder upper part that opposes the upper surface of the opposing-member flange part 522 in the up-down direction, and the flange supporter 613 corresponds to a holder lower part that opposes the lower surface of the opposing-member flange part 522 in the up-down direction.

In a state in which the top plate 5 is at the position illustrated in FIG. 1, the flange supporter 613 is in contact with and supports the outer peripheral portion of the opposing-member flange part 522 of the top plate 5 from the underside. In other words, the opposing-member flange part 522 is held by the opposing-member holder 61 of the opposing-member moving mechanism 6. Thus, the top plate 5 is suspended by the opposing-member holder 61 above the substrate 9 and the substrate holder 31. In the following description, the position in the up-down direction of the top plate 5 illustrated in FIG. 1 is referred to as a "first position." The top plate 5 at the first position is held by the opposing-member moving mechanism 6 and spaced above the substrate holder 31.

The flange supporter 613 includes a movement restricting part 616 that restricts displacement of the top plate 5 (i.e., movement and rotation of the top plate 5). In the example illustrated in FIG. 1, the movement restricting part 616 is a protruding part that protrudes upward from the upper surface of the flange supporter 613. The displacement of the top plate 5 is restricted by the movement restricting part 616 being inserted in a hole provided in the opposing-member flange part 522.

Figure 2:
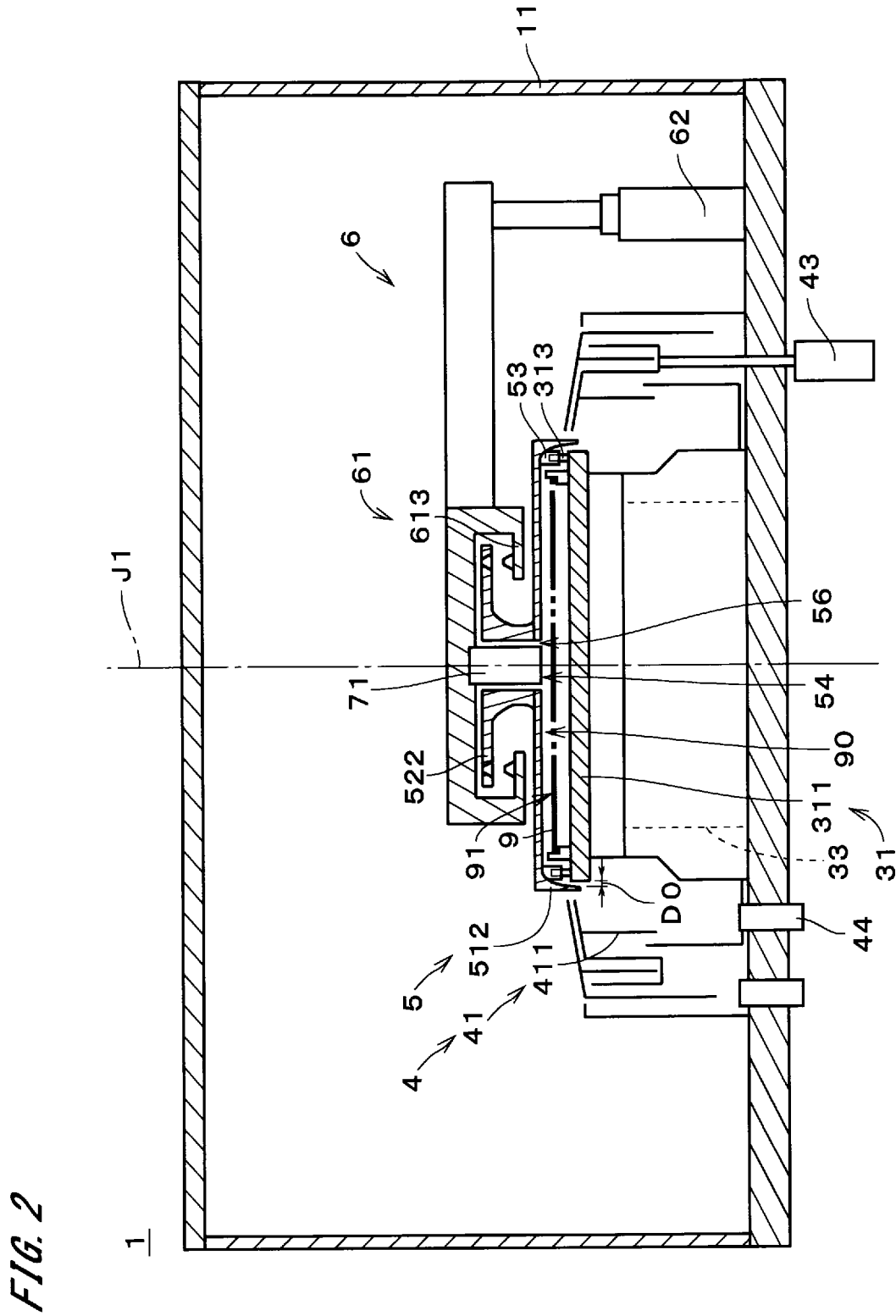
FIG. 2 is a cross-sectional view of the substrate processing apparatus.

The opposing-member elevating mechanism 62 moves the top plate 5 along with the opposing-member holder 61 in the up-down direction. FIG. 2 is a cross-sectional view illustrating a state in which the top plate 5 is moved down from the first position illustrated in FIG. 1. In the following description, the position in the up-down direction of the top plate 5 illustrated in FIG. 2 is referred to as a "second position." That is, the opposing-member elevating mechanism 62 moves the top plate 5 relative to the substrate holder 31 in the up-down direction between the first position and the second position. The second position is below the first position. In other words, the second position is a position at which the top plate 5 is in closer proximity to the substrate holder 31 in the up-down direction than when the top plate 5 is at the first position.

In a state in which the top plate 5 is at the second position, the plurality of engagement parts 53 of the top plate 5 are respectively in engagement with the plurality of engagement parts 313 of the substrate holder 31. The engagement parts 53 are supported from the underside by the engagement parts 313. In other words, the engagement parts 313 serve as an opposing-member supporter that supports the top plate 5. For example, the engagement parts 313 are pins that extend approximately in parallel with the up-down direction, and the upper ends of the engagement parts 313 fit in upwardly opening recesses that are formed in the lower ends of the engagement parts 53. The opposing-member flange part 522 of the top plate 5 is spaced above the flange supporter 613 of the opposing-member holder 61. Thus, the top plate 5 at the second position is held by the substrate holder 31 and spaced from the opposing-member moving mechanism 6 (i.e., not in contact with the opposing-member moving mechanism 6).

In the state in which the top plate 5 is held by the substrate holder 31, the lower end of the opposing-member side wall part 512 of the top plate 5 is located below the upper surface of the holder base 311 of the substrate holder 31. Thus, the inner peripheral surface of the opposing-member side wall part 512 opposes the outer peripheral surface of the substrate holder 31 (i.e., the outer peripheral surface of the holder base 311) in the radial direction. At this time, an approximately sealed processing space 90 is formed between the top plate 5 and the substrate holder 31. When the substrate 9 is rotated and processed with a processing liquid as will be described later, the processing liquid dispersed from the substrate 9 flows from clearance between the inner peripheral surface of the opposing-member side wall part 512 and the outer peripheral surface of the substrate holder 31 to the outside of the processing space 90, and is mainly dispersed outward from the lower end of the opposing-member side wall part 512. The dispersed processing liquid is received by the first cup 41 or the second cup 42. In the example illustrated in FIG. 2, the lower end of the opposing-member side wall part 512 is located below the upper end of the outer peripheral surface of the holder base 311 and is located above the lower end of the outer peripheral surface of the holder base 311.

A distance in the radial direction between the outer peripheral surface of the substrate holder 31 and the inner peripheral surface of the opposing-member side wall part 512 is approximately constant at any position in the circumferential direction. In the following description, the distance in the radial direction between the outer peripheral surface of the substrate holder 31 and the inner peripheral surface of the opposing-member side wall part 512 is referred to as a "holder gap distance D0." The holder gap distance D0 is, for example, a distance in the radial direction between the outer peripheral surface of the substrate holder 31 and the inner peripheral surface of the opposing-member side wall part 512 at a position of the lower end of the opposing-member side wall part 512. In the case where the distance in the radial direction between the outer peripheral surface of the substrate holder 31 and the inner peripheral surface of the opposing-member side wall part 512 is not constant in the up-down direction, the holder gap distance D0 may be a minimum value for this distance. The holder gap distance D0 is, for example, greater than or equal to 1 mm and less than or equal to 3 mm.

When the substrate rotation mechanism 33 is driven while the top plate 5 is at the second position, the substrate holder 31 rotates along with the substrate 9, and the top plate 5 also rotates about the central axis J1 along with the substrate 9 and the substrate holder 31. In other words, the top plate 5 at the second position is rotatable about the central axis J1 along with the substrate holder 31 by the substrate rotation mechanism 33.

Figure 3:
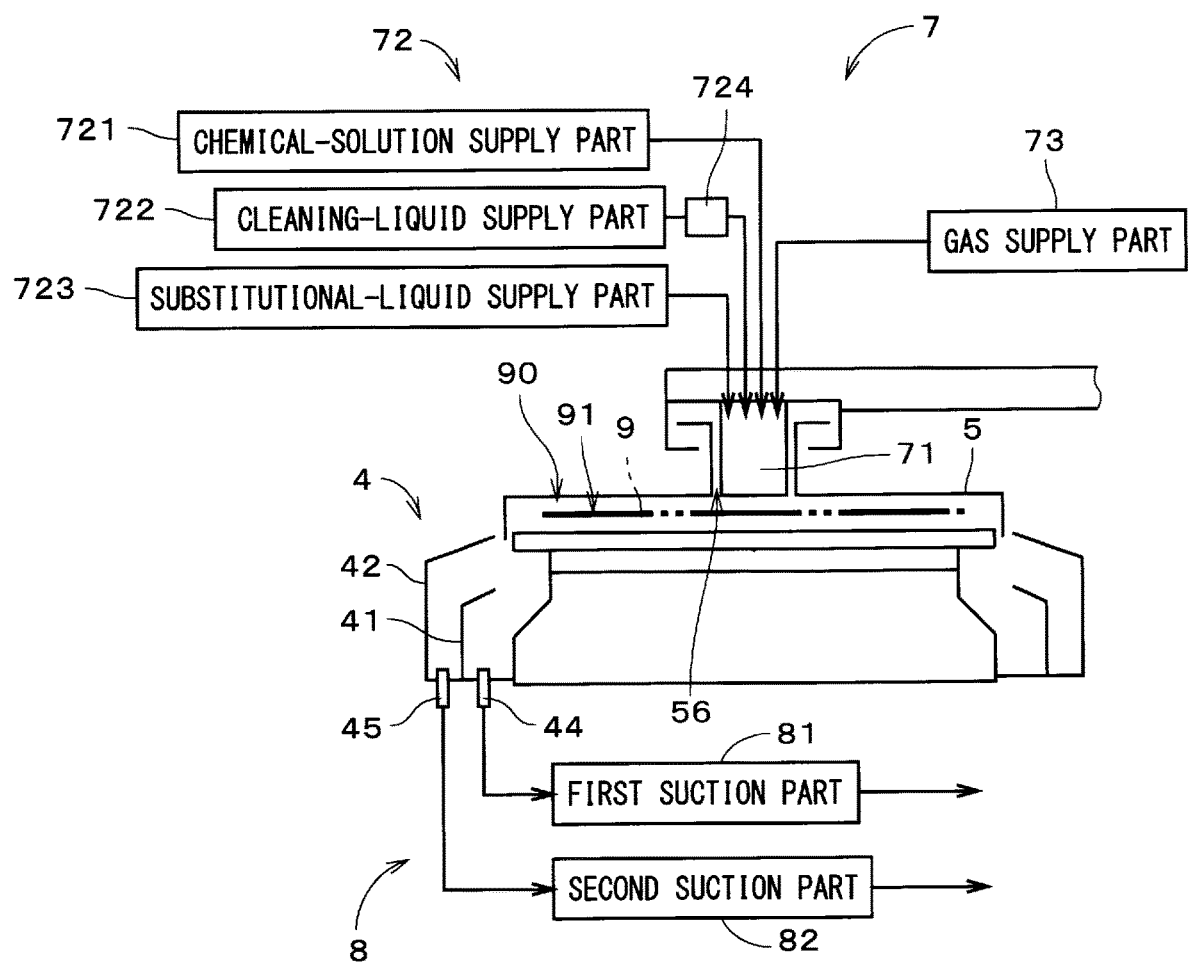
FIG. 3 is a block diagram of a gas-liquid supply part.

FIG. 3 is a block diagram illustrating a gas-liquid supply part 7 and a gas-liquid discharge part 8 for supplying or discharging gases or processing liquids in the substrate processing apparatus 1. The gas-liquid supply part 7 includes the aforementioned processing liquid nozzle 71, a processing-liquid supply part 72, and a gas supply part 73. The processing-liquid supply part 72 supplies a processing liquid to the upper surface 91 of the substrate 9.

The processing-liquid supply part 72 includes a chemical-solution supply part 721, a cleaning-liquid supply part 722, a substitutional-liquid supply part 723, and a temperature controller 724. The chemical-solution supply part 721, the cleaning-liquid supply part 722, and the substitutional-liquid supply part 723 are each connected to the processing liquid nozzle 71. The chemical-solution supply part 721 supplies a chemical solution (e.g., a polymer removing liquid or an etchant such as hydrofluoric acid or an aqueous solution of tetramethylammonium hydroxide) through the processing liquid nozzle 71 to the substrate 9. The cleaning-liquid supply part 722 supplies a cleaning liquid (e.g., deionized water or carbonated water) through the processing liquid nozzle 71 to the substrate 9. The temperature controller 724 is provided on a flow path between the cleaning-liquid supply part 722 and the processing liquid nozzle 71 and controls the temperature of the cleaning liquid supplied to the processing liquid nozzle 71. The substitutional-liquid supply part 723 supplies a substitutional liquid (e.g., isopropyl alcohol; IPA) through the processing liquid nozzle 71 to the substrate 9.

The chemical solution, the cleaning liquid, and the substitutional liquid described above are ejected from ejection ports provided at the lower end surface of the processing liquid nozzle 71 toward the central portion in the radial direction of the upper surface 91 of the substrate 9. The lower end surface of the processing liquid nozzle 71 may have, for example, three ejection ports that correspond respectively to the chemical solution, the cleaning liquid, and the substitutional liquid, or may have a single ejection port from which the chemical solution, the cleaning liquid, and the substitutional liquid are sequentially ejected. In the following description, the chemical solution, the cleaning liquid, and the substitutional liquid described above may be collectively or individually referred to simply as a "processing liquid."

The gas supply part 73 is connected to the processing liquid nozzle 71 and supplies a gas through the processing liquid nozzle 71 to the processing space 90, which is the space between the lower surface of the top plate 5 and the upper surface 91 of the substrate 9. More specifically, the gas from the gas supply part 73 is supplied from jet openings provided in the lower end surface of the processing liquid nozzle 71 to the processing space 90. The processing liquid nozzle 71 also has jet openings in the side surface thereof, and the gas from the gas supply part 73 is also supplied from these jet openings through the nozzle gap 56 to the processing space 90. The gas supplied from the gas supply part 73 may be an inert gas such as a nitrogen ($N_2$) gas. In the substrate processing apparatus 1, the substrate 9 is preferably processed in the processing space 90 that is placed in an inert gas atmosphere through the supply of an inert gas from the processing liquid nozzle 71 to the processing space 90. In other words, the gas supplied from the gas supply part 73 to the processing space 90 is a treatment atmospheric gas. The gas supply part 73 may supply various gases other than inert gases as a treatment atmospheric gas.

The gas-liquid discharge part 8 includes the aforementioned first and second discharge ports 44 and 45, a first suction part 81, and a second suction part 82. The first suction part 81 is connected to the first discharge port 44 at the bottom of the first cup 41. The first suction part 81 draws gases and processing liquids in the first cup 41 by suction through the first discharge port 44. The gases and processing liquids drawn by suction by the first suction part 81 are separated by a gas-liquid separator (not shown). The processing liquids separated by the gas-liquid separator are discarded or recovered. The second suction part 82 draws gases and processing liquids in the second cup 42 by suction through the second discharge port 45. The gases and processing liquids drawn by suction by the second suction part 82 are separated by a gas-liquid separator (not shown). The processing liquids separated by the gas-liquid separator are discarded or recovered. The first suction part 81 and the second suction part 82 serve as a gas discharge part connected to the cup part 4 and for discharging gases in the cup part 4 by suction to the outside of the cup part 4.

Figure 4:
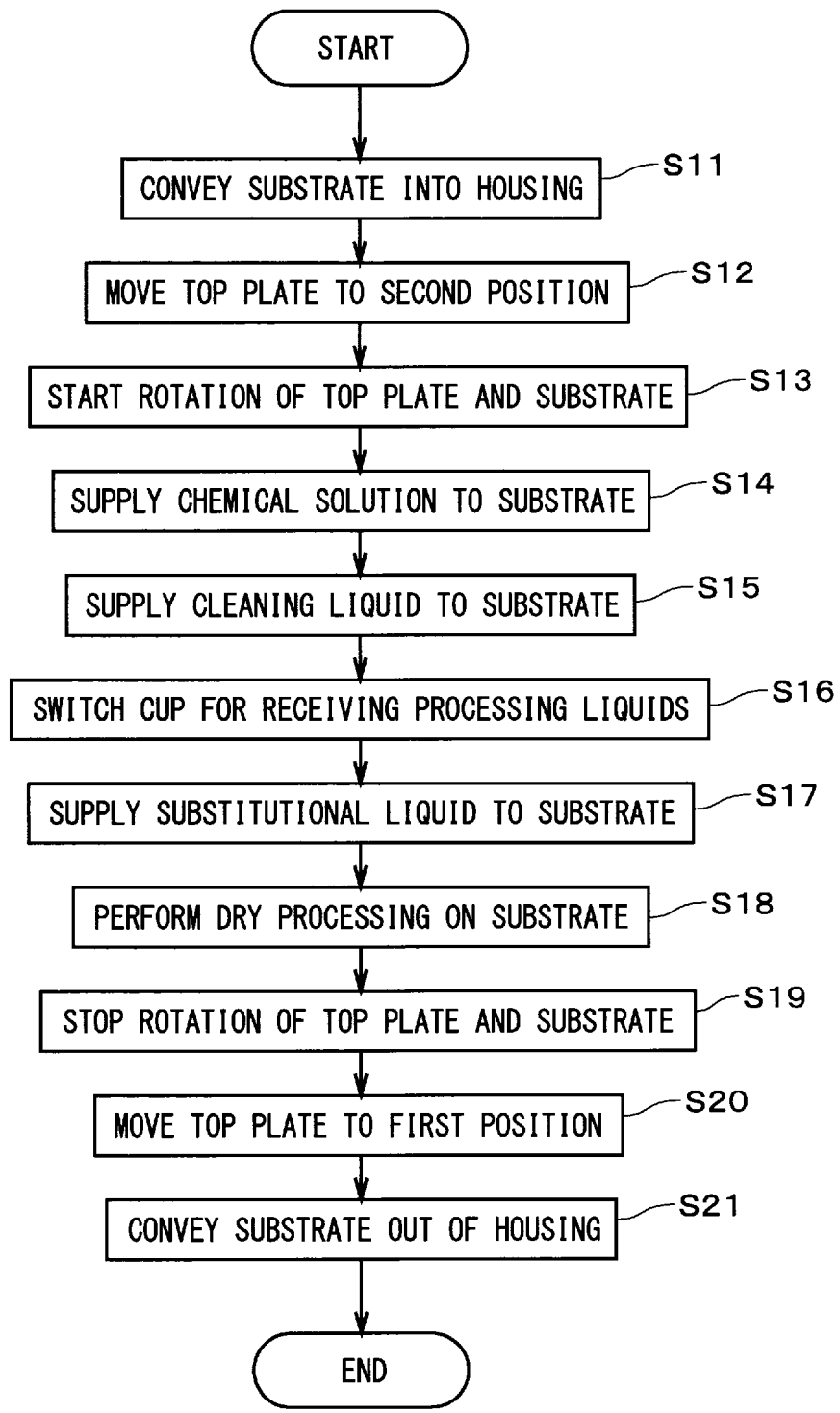
FIG. 4 illustrates a procedure of processing performed on a substrate.

Next, an exemplary procedure of processing performed on the substrate 9 in the substrate processing apparatus 1 will be described with reference to FIGS. 4 and 5. First, the substrate 9 is conveyed into the housing 11 and held by the substrate holder 31 while the top plate 5 is at the first position illustrated in FIG. 1 (step S11). At this time, the top plate 5 is held by the opposing-member holder 61 of the opposing-member moving mechanism 6.

Then, the opposing-member holder 61 is moved down by the opposing-member elevating mechanism 62. This movement causes the top plate 5 to move down from the first position to the second position and to be held by the substrate holder 31 as illustrated in FIG. 2 (step S12). Then, the gas supply part 73 (see FIG. 3) starts supplying an inert gas (i.e., treatment atmospheric gas) to the nozzle gap 56 and the processing space 90 through the processing liquid nozzle 71.

Next, the controller 12 (see FIG. 1) controls the substrate rotation mechanism 33 to start rotation of the substrate holder 31, the substrate 9, and the top plate 5 (step S13). The supply of the inert gas from the processing liquid nozzle 71 continues in step S13 onward. The controller 12 then controls the chemical-solution supply part 721 of the processing-liquid supply part 72 so that a chemical solution is supplied from the chemical-solution supply part 721 to the processing liquid nozzle 71 and supplied through the opposing-member opening 54 of the top plate 5 at the second position to the central portion of the upper surface 91 of the rotating substrate 9 (step S14).

The chemical solution supplied from the processing liquid nozzle 71 to the central portion of the substrate 9 is spread radially outward from the central portion of the substrate 9 by the rotation of the substrate 9 and distributed across the upper surface 91 of the substrate 9. The chemical solution is dispersed radially outward from the outer edge of the substrate 9 by a centrifugal force and discharged from the processing space 90 through the space between the outer peripheral surface of the holder base 311 and the inner peripheral surface of the opposing-member side wall part 512. In the substrate processing apparatus 1, the top plate 5 also rotates about the central axis J1 when the substrate holder 31 rotates. Thus, the chemical solution is discharged from the processing space 90 by a centrifugal force even if the chemical solution adheres to the lower surface of the top plate 5.

Figure 6:
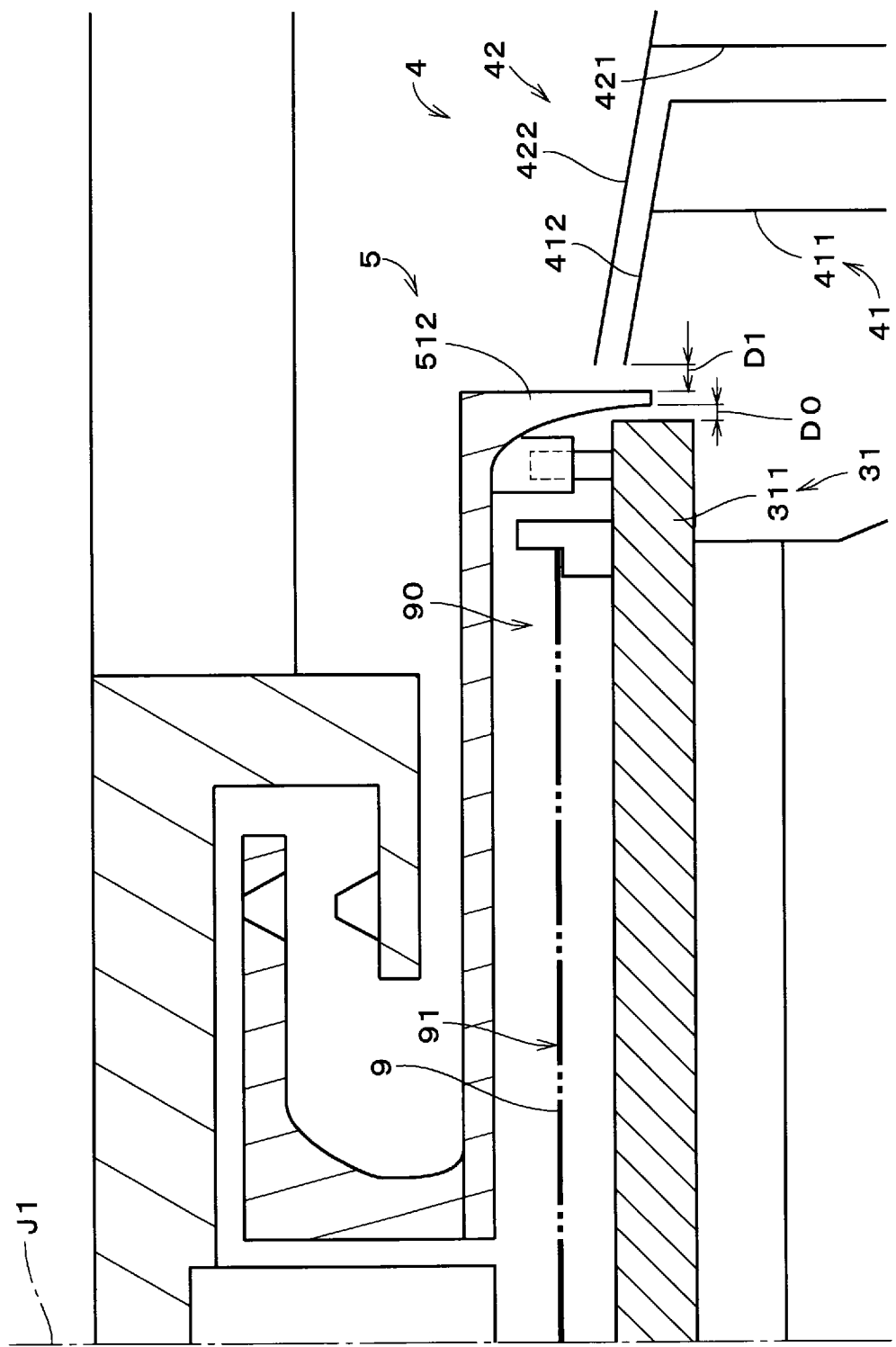
FIG. 6 is an enlarged cross-sectional view of part of the substrate processing apparatus.

FIG. 6 is an enlarged cross-sectional view of part of the substrate processing apparatus 1. In the cup part 4 illustrated in FIG. 6, the first cup 41 and the second cup 42 are disposed around the substrate holder 31 and the top plate 5. The first-cup canopy part 412 of the first cup 41 is in close proximity to the lower surface of the second-cup canopy part 422 of the second cup 42 at a slight interval. The inner peripheral edge of the first-cup canopy part 412 is located above the lower end of the opposing-member side wall part 512. The inner peripheral edge of the first-cup canopy part 412 opposes the outer peripheral surface of the opposing-member side wall part 512 in the radial direction. The distance in the radial direction between the inner peripheral edge of the first-cup canopy part 412 and the outer peripheral surface of the opposing-member side wall part 512 is approximately constant at any position in the circumferential direction.

In the following description, the distance in the radial direction between the inner peripheral edge of the first-cup canopy part 412 and the outer peripheral surface of the opposing-member side wall part 512 is referred to as a "first-cup gap distance D1." The first-cup gap distance D1 is greater than the aforementioned holder gap distance D0. The first-cup gap distance D1 is, for example, greater than or equal to 3 mm and less than or equal to 6 mm. In the following description, the position of the first cup 41 illustrated in FIG. 2 is referred to as a "first processing position." In a state in which the first cup 41 is at the first processing position, the lower portion of the outer peripheral surface of the opposing-member side wall part 512 opposes the inner peripheral surface of the first-cup side wall part 411 in the radial direction. The lower portion of the outer peripheral surface of the holder base 311 also opposes the inner peripheral surface of the first-cup side wall part 411 in the radial direction.

In step S14, in the state in which the first cup 41 is at the first processing position, the chemical solution supplied to the upper surface 91 of the rotating substrate 9 is discharged from the processing space 90 as described above and received by the first cup 41 of the cup part 4. The chemical solution received by the first cup 41 is discharged through the first discharge port 44 provided at the bottom of the first cup 41 to the outside of the housing 11. In the substrate processing apparatus 1, the processing of the substrate 9 using the chemical solution (i.e., chemical solution processing) ends if the chemical solution is applied to the substrate 9 for a predetermined period of time. Note that the supply of the chemical solution (step S14) may occur prior to the start of rotation of the substrate 9 (step S13). In this case, the chemical solution puddles (form paddles) across the upper surface 91 of the substrate 9 that is in a stationary state, and puddling is performed using the chemical solution.

The supply of the chemical solution from the processing liquid nozzle 71 stops when the chemical solution processing of the substrate 9 is completed. Then, the controller 12 controls the cleaning-liquid supply part 722 (see FIG. 3) so that a cleaning liquid is supplied from the cleaning-liquid supply part 722 to the processing liquid nozzle 71 and supplied through the opposing-member opening 54 of the top plate 5 at the second position to the central portion of the upper surface 91 of the rotating substrate 9 (step S15).

The cleaning liquid supplied from the processing liquid nozzle 71 to the central portion of the substrate 9 is spread radially outward from the central portion of the substrate 9 by the rotation of the substrate 9 and distributed across the upper surface 91 of the substrate 9. The chemical solution remaining on the upper surface 91 of the substrate 9 is washed away with the cleaning liquid and removed from the surface of the substrate 9. The cleaning liquid and the washed chemical solution are dispersed radially outward from the outer edge of the substrate 9 by a centrifugal force and discharged from the processing space 90 through the space between the outer peripheral surface of the holder base 311 and the inner peripheral surface of the opposing-member side wall part 512. The cleaning liquid and other fluids are also discharged from the processing space 90 by a centrifugal force even if they adhere to the lower surface of the top plate 5.

In step S15, in the state in which the first cup 41 is at the first processing position, the cleaning liquid supplied to the upper surface 91 of the rotating substrate 9 is discharged from the processing space 90 as described above and received by the first cup 41 of the cup part 4. The cleaning liquid received by the first cup 41 is discharged through the first discharge port 44 provided at the bottom of the first cup 41 to the outside of the housing 11. In the substrate processing apparatus 1, the processing of the substrate 9 using the cleaning liquid (i.e., cleaning processing) ends if the cleaning liquid is applied to the substrate 9 for a predetermined of time.

Figure 5:
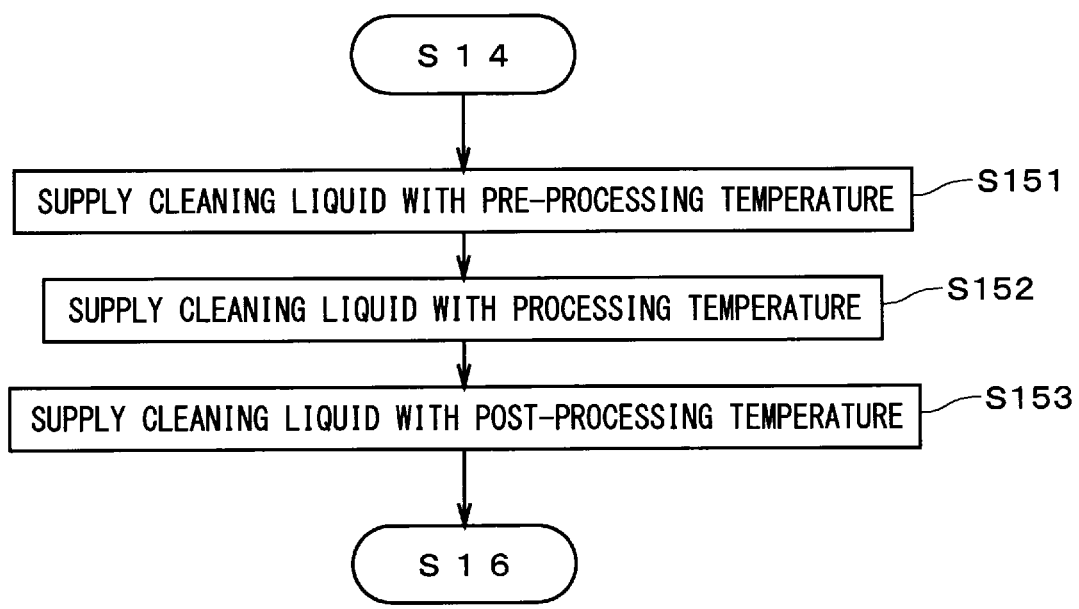
FIG. 5 illustrates part of the procedure of processing performed on a substrate.

FIG. 5 illustrates a detailed procedure of the cleaning processing performed in step S15. In the substrate processing apparatus 1, as illustrated in FIG. 5, the cleaning liquid having a temperature that is adjusted to a predetermined pre-processing temperature is supplied from the processing liquid nozzle 71 to the surface of the substrate 9 after the chemical solution processing in step S14 has ended (step S151). The temperature of the cleaning liquid supplied to the substrate 9 is controlled by the aforementioned temperature controller 724. The pre-processing temperature is, for example, normal temperature (i.e., temperature approximately equal to room temperature).

After the cleaning liquid with the pre-processing temperature has been supplied for a predetermined period of time, the temperature of the cleaning liquid supplied from the processing liquid nozzle 71 is changed to a predetermined processing temperature by the temperature controller 724. The processing temperature is higher than the pre-processing temperature and higher than normal temperature. In the substrate processing apparatus 1, the cleaning processing of the substrate 9 is performed by supplying the cleaning liquid with the processing temperature (e.g., approximately 80 degrees centigrade) to the upper surface 91 of the substrate 9 for a predetermined period of time (step S152). This contact with the cleaning liquid having the processing temperature increases the temperature of the upper surface 91 of the substrate 9 to a temperature higher than normal temperature.

When the cleaning processing of the substrate 9 using the cleaning liquid with the processing temperature is completed, the temperature of the cleaning liquid supplied from the processing liquid nozzle 71 is changed to a predetermined post-processing temperature by the temperature controller 724. The post-processing temperature is lower than the processing temperature and is, for example, normal temperature. The post-processing temperature may be the same as or different from the pre-processing temperature. Then, the cleaning liquid with the post-processing temperature is supplied to the upper surface 91 of the substrate 9 for a predetermined period of time so as to cool the substrate 9 (step S153). The cleaning processing of the substrate 9 using the cleaning liquid with the pre-processing temperature, the processing temperature, and the post-processing temperature ends after execution of steps S151 to S153.

Figure 7:
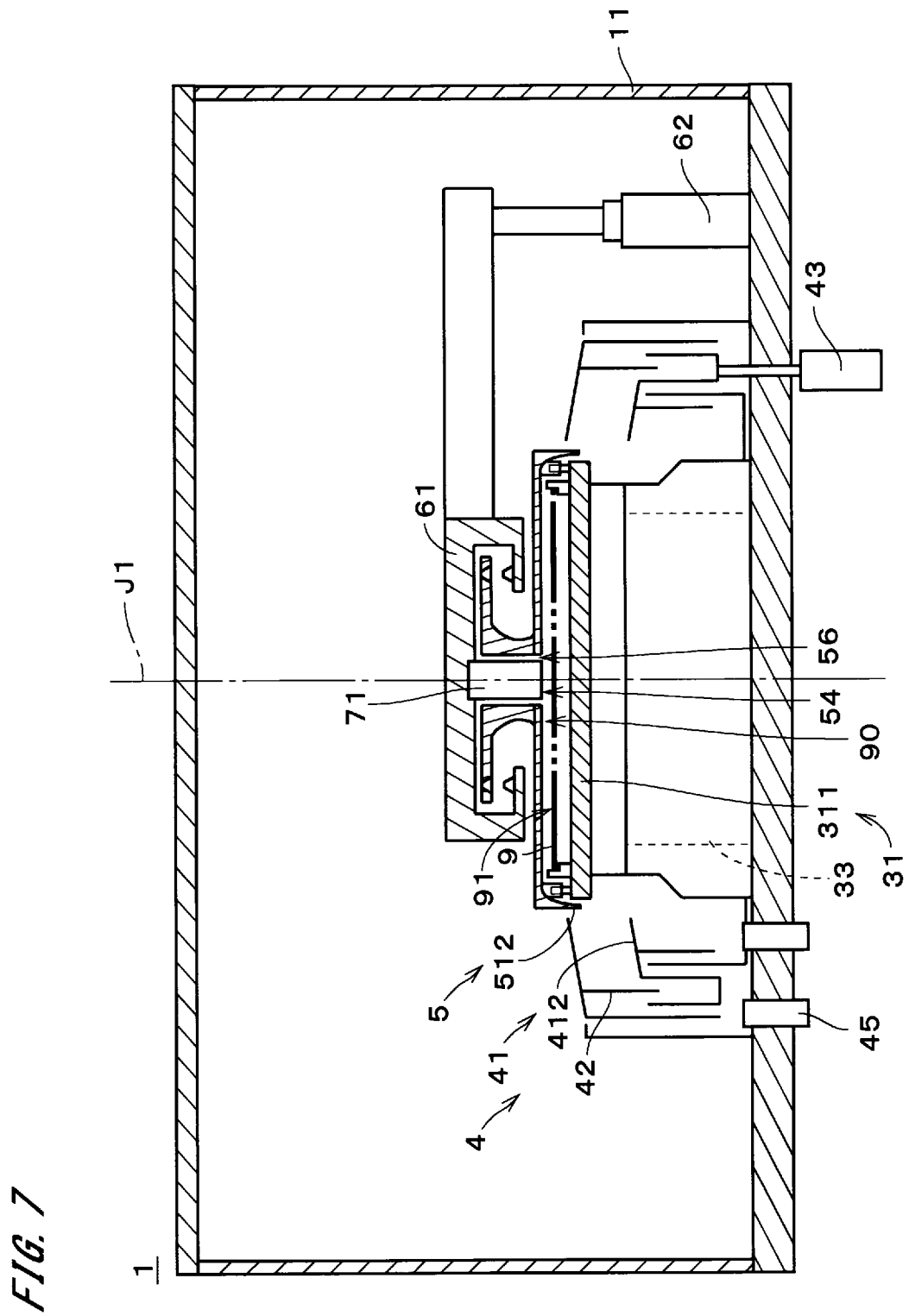
FIG. 7 is a cross-sectional view of the substrate processing apparatus.

The supply of the cleaning liquid from the processing liquid nozzle 71 stops when the processing of the substrate 9 using the cleaning liquid is completed. At this time, a thin liquid film of cleaning liquid exists on the upper surface 91 of the substrate 9. Then, the first cup 41 is moved down by the cup moving mechanism 43 and positioned at the second processing position below the first processing position illustrated in FIG. 2, as illustrated in FIG. 7. In the state in which the first cup 41 is at the second processing position, the inner peripheral edge of the first-cup canopy part 412 is located below the lower end of the opposing-member side wall part 512. Thus, the second cup 42 opposes the substrate holder 31 and the top plate 5 in the radial direction, and the cup for receiving processing liquids from the substrate 9 is switched from the first cup 41 to the second cup 42 (step S16).

Figure 8:
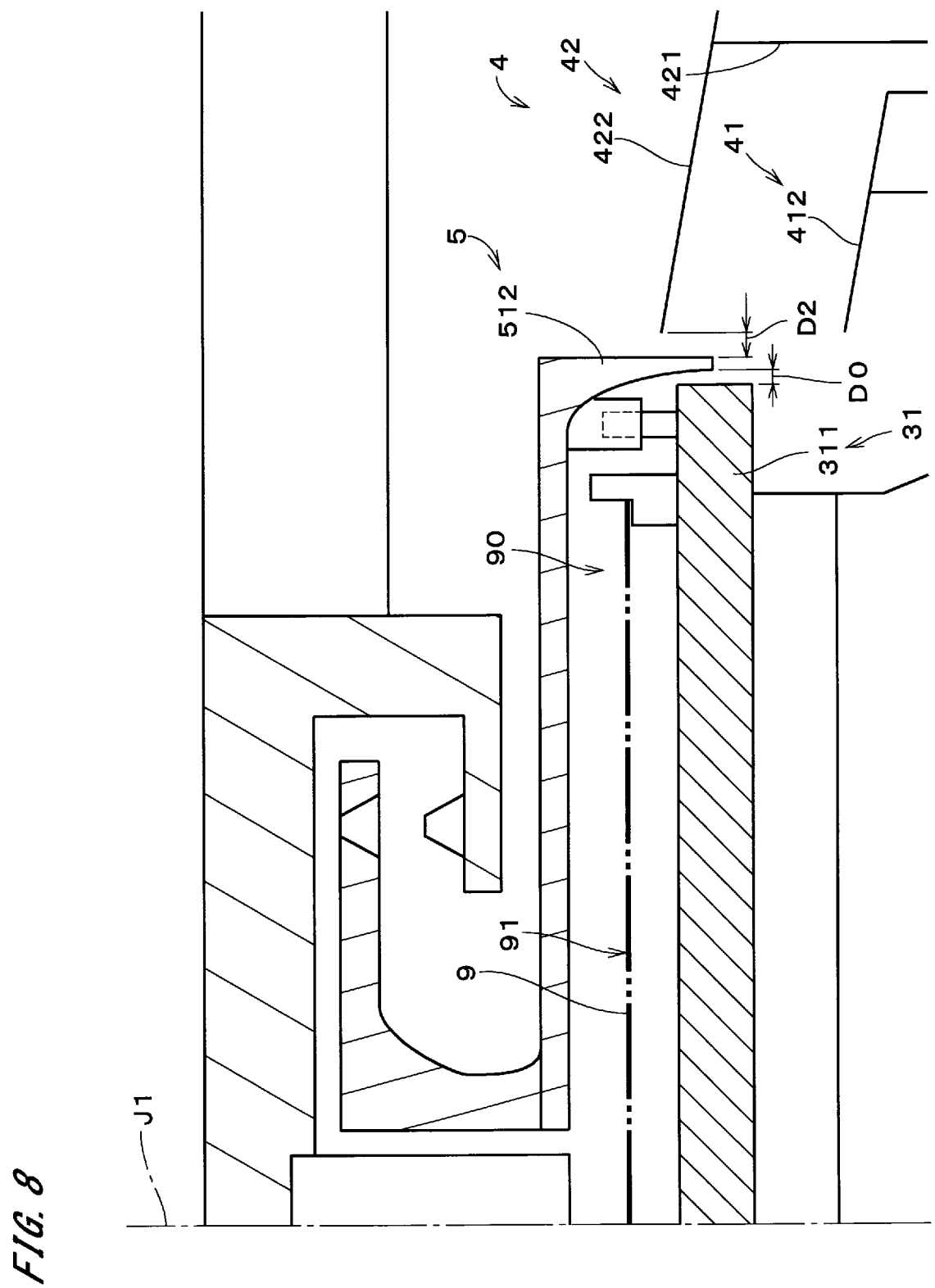
FIG. 8 is an enlarged cross-sectional view of part of the substrate processing apparatus.

FIG. 8 is an enlarged cross-sectional view of part of the substrate processing apparatus 1. In the cup part 4 illustrated in FIG. 8, the second cup 42 is disposed around the substrate holder 31 and the top plate 5. The inner peripheral edge of the second-cup canopy part 422 is located above the lower end of the opposing-member side wall part 512. The inner peripheral edge of the second-cup canopy part 422 opposes the outer peripheral surface of the opposing-member side wall part 512 in the radial direction. A distance in the radial direction between the inner peripheral edge of the second-cup canopy part 422 and the outer peripheral surface of the opposing-member side wall part 512 is approximately constant at any position in the circumferential direction.

In the following description, the distance in the radial direction between the inner peripheral edge of the second-cup canopy part 422 and the outer peripheral surface of the opposing-member side wall part 512 is referred to as a "second-cup gap distance D2." The second-cup gap distance D2 is greater than the aforementioned holder gap distance D0. The second-cup gap distance D2 is, for example, greater than or equal to 3 mm and less than or equal to 6 mm. The second-cup gap distance D2 may be the same as or different from the first-cup gap distance D1 (see FIG. 6). The lower portion of the outer peripheral surface of the opposing-member side wall part 512 opposes the inner peripheral surface of the second-cup side wall part 421 in the radial direction. The lower portion of the outer peripheral surface of the holder base 311 also opposes the inner peripheral surface of the second-cup side wall part 421 in the radial direction.

As described above, after the first cup 41 is moved to the second processing position, the controller 12 controls the substitutional-liquid supply part 723 (see FIG. 3) so that a substitutional liquid is supplied from the substitutional-liquid supply part 723 to the processing liquid nozzle 71 and supplied through the opposing-member opening 54 of the top plate 5 at the second position to the central portion of the upper surface 91 of the rotating substrate 9 (step S17).

The substitutional liquid supplied from the processing liquid nozzle 71 to the central portion of the substrate 9 is spread radially outward from the central portion of the substrate 9 by the rotation of the substrate 9 and distributed across the upper surface 91 of the substrate 9. The cleaning liquid remaining on the upper surface 91 of the substrate 9 is pushed radially outward by the substitutional liquid and removed from the surface of the substrate 9. This allows the substitutional liquid to be substituted for the cleaning liquid on the substrate 9. If IPA is used as the substitutional liquid, IPA substitution processing is performed in step S17. The substitutional liquid is dispersed radially outward from the outer edge of the substrate 9 by a centrifugal force and discharged from the processing space 90 through the space between the outer peripheral surface of the holder base 311 and the inner peripheral surface of the opposing-member side wall part 512. The substitutional liquid and other fluids are also discharged from the processing space 90 by a centrifugal force even if they adhere to the lower surface of the top plate 5.

In step S17, in the state in which the first cup 41 is at the second processing position illustrated in FIG. 7, the substitutional liquid supplied to the upper surface 91 of the rotating substrate 9 is discharged from the processing space 90 as described above and received by the second cup 42 of the cup part 4. The substitutional liquid received by the second cup 42 is discharged through the second discharge port 45 provided at the bottom of the second cup 42 to the outside of the housing 11. In the substrate processing apparatus 1, the processing of the substrate 9 using the substitutional liquid (i.e., substitution processing) ends if the substitutional liquid is applied to the substrate 9 for a predetermined period of time.

The supply of the substitutional liquid from the processing liquid nozzle 71 stops when the processing of the substrate 9 using the substitutional liquid is completed. Then, the gas supply part 73 (see FIG. 3) increases the flow rate of the inert gas ejected from the side surface of the processing liquid nozzle 71 toward the nozzle gap 56. The gas supply part 73 also increases the flow rate of the inert gas ejected from the lower end surface of the processing liquid nozzle 71 toward the processing space 90. Moreover, the controller 12 (see FIG. 1) controls the substrate rotation mechanism 33 to increase the rotational speeds of the substrate holder 31, the substrate 9, and the top plate 5. Accordingly, the substitutional liquid remaining on the upper surface 91 of the substrate 9 is thrown radially outward, dispersed radially outward from the outer edge of the substrate 9, and discharged from the processing space 90 through the space between the holder base 311 and the opposing-member side wall part 512. The substitutional liquid or other fluids discharged from the processing space 90 is received by the second cup 42 of the cup part 4. The dry processing for removing the substitutional liquid from the upper surface 91 of the substrate 9 is performed by continuing the rotation of the substrate 9 for a predetermined period of time (step S18).

The rotation of the substrate holder 31, the substrate 9, and the top plate 5 by the substrate rotation mechanism 33 stops when the dry processing of the substrate 9 is completed (step S19). The supply of the inert gas from the gas supply part 73 to the nozzle gap 56 and the processing space 90 also stops. Next, the opposing-member holder 61 is moved upward by the opposing-member elevating mechanism 62 so that the top plate 5 is moved up from the second position to the first position illustrated in FIG. 1 (step S20). The top plate 5 is spaced above the substrate holder 31 and held by the opposing-member holder 61. Thereafter, the substrate 9 is conveyed out of the housing 11 (step S21). In the substrate processing apparatus 1, the above-described steps S11 to S21 are performed sequentially on a plurality of substrates 9 to sequentially process the substrates 9.

As described above, the substrate processing apparatus 1 includes the substrate holder 31, the substrate rotation mechanism 33, the cup part 4, the top plate 5, the processing-liquid supply part 72, the gas supply part 73, and the gas discharge part (i.e., the first suction part 81 and the second suction part 82). The substrate holder 31 has a disk-like shape having an outer diameter larger than the outer diameter of the substrate 9. The substrate holder 31 is disposed below the substrate 9 and holds the substrate 9 in a horizontal position. The substrate rotation mechanism 33 rotates the substrate holder 31 about the central axis J1 pointing in the up-down direction. The top plate 5 is an opposing member that opposes the upper surface 91 of the substrate 9. The processing-liquid supply part 72 supplies processing liquids to the upper surface 91 of the substrate 9. The gas supply part 73 supplies a treatment atmospheric gas to the processing space 90, which is the space between the lower surface of the top plate 5 and the upper surface 91 of the substrate 9. The cup part 4 is disposed around the substrate holder 31 and receives the processing liquids from the substrate 9. The gas discharge part discharges the gas in the cup part 4 to the outside of the cup part 4.

The top plate 5 includes the opposing-member canopy part 511 and the opposing-member side wall part 512. The opposing-member canopy part 511 opposes the upper surface 91 of the substrate 9. The opposing-member side wall part 512 extends downward from the outer peripheral portion of the opposing-member canopy part 511. The outer peripheral surface of the opposing-member side wall part 512 has a cylindrical shape. The inner peripheral surface of the opposing-member side wall part 512 opposes the outer peripheral surface of the substrate holder 31 in the radial direction.

The cup part 4 includes the first cup 41, the second cup 42, and the cup moving mechanism 43. The first cup 41 includes the first-cup side wall part 411 of a cylindrical shape and the first-cup canopy part 412 of a circular ring plate-like shape. The first-cup canopy part 412 extends radially inward from the upper edge of the first-cup side wall part 411. The second cup 42 is disposed radially outward of the first cup 41. The second cup 42 includes the second-cup side wall part 421 of a cylindrical shape and the second-cup canopy part 422 of a circular ring plate-like shape. The second-cup canopy part 422 extends radially inward from the upper edge of the second-cup side wall part 421. The cup moving mechanism 43 moves the first cup 41 relative to the substrate holder 31 in the up-down direction.

In the state in which the first cup 41 is at the first processing position, the inner peripheral edge of the first-cup canopy part 412 opposes the outer peripheral surface of the opposing-member side wall part 512 in the radial direction. In the state in which the first cup 41 is at the second processing position, the inner peripheral edge of the first-cup canopy part 412 is located below the lower end of the opposing-member side wall part 512.

Here, if the chemical solution and the cleaning liquid described above are referred to as "first processing liquids" and the substitutional liquid as a "second processing liquid," the chemical-solution supply part 721 and the cleaning-liquid supply part 722 serve as a first processing-liquid supply part for supplying the first processing liquids to the substrate 9, and the substitutional-liquid supply part 723 serves as a second processing-liquid supply part for supplying the second processing liquid to the substrate 9. In the substrate processing apparatus 1, in the state in which the first cup 41 is at the aforementioned first processing position, the first processing liquids from the substrate 9 (i.e., first processing liquids supplied to the upper surface 91 of the rotating substrate 9) are received by the first cup 41. In the state in which the first cup 41 is at the aforementioned second processing position, the second processing liquid from the substrate 9 (i.e., second processing liquid supplied to the upper surface 91 of the rotating substrate 9) is received by the second cup 42.

In the substrate processing apparatus 1, the inner peripheral edge of the second-cup canopy part 422 opposes the outer peripheral surface of the opposing-member side wall part 512 in the radial direction. This suppresses the possibility that the first processing liquid received by the first cup 41 and the second processing liquid received by the second cup 42 may be dispersed from the space radially inward of the inner peripheral edge of the second-cup canopy part 422 to the space above the second-cup canopy part 422 (i.e., the first processing liquid and the second processing liquid may be dispersed to the space above the cup part 4).

In the substrate processing apparatus 1, there is an airflow (so-called downflow) from the upper part of the housing 11 toward the lower part in the space of the housing 11 above the cup part 4. The airflow flows into the cup part 4 from the space between the opposing-member side wall part 512 of the top plate 5 and the inner peripheral edge of the second-cup canopy part 422 of the second cup 42 and is discharged by suction from the bottom of the cup part 4 to the outside of the cup part 4 by the gas discharge part. Here, if the gap between the outer peripheral surface of the opposing-member side wall part 512 and the inner peripheral edge of the second-cup canopy part 422 is extremely small, the velocity of the airflow from the gap into the cup part 4 may increase excessively. If, in this condition, the second processing liquid dispersed from the substrate 9 tries to be received by the second cup 42, the second processing liquid may be pushed downward by the airflow and flow into the first cup 41 located at the second processing position below the second cup 42.

In contrast, in the substrate processing apparatus 1 illustrated in FIG. 8, the second-cup gap distance D2, which is the distance in the radial direction between the outer peripheral surface of the opposing-member side wall part 512 and the inner peripheral edge of the second-cup canopy part 422, is greater than the holder gap distance D0, which is the distance in the radial direction between the inner peripheral surface of the opposing-member side wall part 512 and the outer peripheral surface of the substrate holder 31. By preventing the gap between the outer peripheral surface of the opposing-member side wall part 512 and the inner peripheral edge of the second-cup canopy part 422 from becoming excessively small in this way, it is possible to prevent an excessive increase in the velocity of the airflow from the gap into the cup part 4. As a result, it is possible to prevent or suppress the possibility that, when the second processing liquid dispersed from the substrate 9 is received by the second cup 42 (i.e., when the second processing liquid dispersed from the substrate 9 moves to the second cup 42), the second processing liquid may be carried downward by the airflow, and it is possible to prevent or suppress the possibility that the second processing liquid may flow into the first cup 41 located at the second processing position. In other words, the first processing liquid and the second processing liquid are separately received by the first cup 41 and the second cup 42 in the substrate processing apparatus 1. In another way, a plurality of types of processing liquids are separately received by a plurality of cups in the substrate processing apparatus 1.

In the substrate processing apparatus 1, the lower surface of the second-cup canopy part 422 includes an inclined surface that is inclined downward outwardly in the radial direction from the inner peripheral edge of the second-cup canopy part 422. This suppresses the possibility that the second processing liquid dispersed from the substrate 9 and colliding with the inner surface of the second cup 42 may be dispersed upward, and allows the second processing liquid to be guided downward in the second cup 42. As a result, it is possible to further suppress the possibility that the second processing liquid received by the second cup 42 may be dispersed to the space above the cup part 4.

As described above, in the substrate processing apparatus 1, the opposing-member canopy part 511 has the opposing-member opening 54 in the central portion thereof, and the first processing liquids (i.e., the chemical solution and the cleaning liquid) and the second processing liquid (i.e., the substitutional liquid) from the processing-liquid supply part 72 are supplied through the opposing-member opening 54 to the upper surface 91 of the substrate 9. Here, if the gap between the outer peripheral surface of the opposing-member side wall part 512 and the inner peripheral edge of the first-cup canopy part 412 is extremely small, a relatively huge pressure drop may occur in the vicinity of the outer peripheral surface of the opposing-member side wall part 512 when the first cup 41 is moved down from the first processing position to the second processing position. Because this pressure drop will cause a pressure drop in the processing space 90, there is, for example, a possibility that the atmosphere outside the processing space 90 may flow into the processing space 90 through the nozzle gap 56 and the opposing-member opening 54 and change the atmosphere in the processing space 90 from a desired state.

In contrast, in the substrate processing apparatus 1 illustrated in FIG. 6, the first-cup gap distance D1, which is the distance in the radial direction between the outer peripheral surface of the opposing-member side wall part 512 and the inner peripheral edge of the first-cup canopy part 412, is greater than the aforementioned holder gap distance D0. By preventing the gap between the outer peripheral surface of the opposing-member side wall part 512 and the inner peripheral edge of the first-cup canopy part 412 from becoming excessively small in this way, it is possible to prevent or suppress the occurrence of a pressure drop in the vicinity of the outer peripheral surface of the opposing-member side wall part 512 and a pressure drop in the processing space 90, due to the movement of the first cup 41 in the up-down direction. As a result, the flow of the external atmosphere into the processing space 90 will be suppressed or prevented, and an unintentional change in the atmosphere in the processing space 90 will also be suppressed or prevented. As in the case of the second cup 42, it is also possible to prevent the possibility that the velocity of airflow flowing from the gap between the outer peripheral surface of the opposing-member side wall part 512 and the inner peripheral edge of the first-cup canopy part 412 into the first cup 41 may increase excessively, while suppressing or preventing dispersion of the first processing liquid to the space above the first cup 41.

In the substrate processing apparatus 1, the lower surface of the first-cup canopy part 412 includes an inclined surface that is inclined downward outwardly in the radial direction from the inner peripheral edge of the first-cup canopy part 412. This suppresses the possibility that the first processing liquid dispersed from the substrate 9 and colliding with the first cup 41 may be dispersed upward, and allows the first processing liquid to be guided downward in the first cup 41. As a result, it is possible to further suppress the possibility that the first processing liquid received by the first cup 41 may be dispersed to the space above the first cup 41.

As described above, in the substrate processing apparatus 1, the top plate 5 rotates about the central axis J1 when the substrate holder 31 rotates. Thus, processing liquids adhering to the lower surface of the top plate 5 will be carried radially outward by a centrifugal force and removed from the lower surface. In other words, it is possible to prevent processing liquids from adhering to the top plate 5. In addition, the treatment atmospheric gas supplied to the processing space 90 will be quickly diffused radially outward by the rotation of the top plate 5 and the substrate 9. As a result, the treatment atmospheric gas will be efficiently diffused across the processing space 90, and the amount of usage of the treatment atmospheric gas will be reduced.

The top plate 5 is held by the substrate holder 31 and rotated along with the substrate holder 31 by the substrate rotation mechanism 33. This eliminates the need to provide another mechanism for rotating the top plate 5 separately from the substrate rotation mechanism 33, thus simplifying the structure of the apparatus.

In the above-described example, the cleaning liquid is a first processing liquid received by the first cup 41. When the cleaning processing is performed on the substrate 9, the cleaning liquid is supplied to the upper surface 91 of the substrate 9 at a processing temperature higher than normal temperature. This improves the efficiency of the cleaning processing of the substrate 9 and shortens the time required for the cleaning processing of the substrate 9.

In the substrate processing apparatus 1, the dry processing for removing liquids from the surface of the substrate 9 by rotating the substrate 9 via the substrate rotation mechanism 33 is performed after completion of the cleaning processing, and the processing for cooling the substrate 9 by supplying a processing liquid having a temperature lower than the aforementioned processing temperature is performed between the cleaning processing and the dry processing. In this way, the cooling of the substrate 9 whose temperature is increased through the cleaning processing using the cleaning liquid having a processing temperature higher than normal temperature is performed prior to the dry processing. This prevents or suppresses the possibility that a slight amount of ionic substances that may remain in the processing space 90 may adversely affect devices on the substrate 9 during the dry processing. Note that the processing liquid supplied to the substrate 9 in step S153 may be the same as or different from the cleaning liquid used in the cleaning processing (step S152) performed at the processing temperature.

In the substrate processing apparatus 1, the processing liquid with a temperature lower than the processing temperature higher than normal temperature is supplied (step S151) prior to the cleaning processing (step S152) using the cleaning liquid having the processing temperature. Thus, the chemical solution remaining on the substrate 9 will be washed away (i.e., removed) from the surface of the substrate 9 without increasing the temperature of the chemical solution. As a result, it is possible to suppress an increase in the reactivity of the chemical solution remaining on the substrate 9 and to prevent or suppress the occurrence of, for example, unintentional reactions of the chemical solution when washed away from the surface of the substrate 9. Note that the processing liquid supplied to the substrate 9 in step S151 may be the same as or different from the cleaning liquid used in the cleaning processing (step S152) performed at the processing temperature.

The above-described substrate processing apparatus 1 may be modified in various ways.

In the substrate processing apparatus 1, the top plate 5 does not necessarily have to be held by the substrate holder 31 when the chemical solution processing, the cleaning processing, and the dry processing are performed on the substrate 9. For example, the top plate 5 may be spaced from the substrate holder 31 above the substrate 9 and may be rotated by another rotation mechanism that is provided independently of the substrate rotation mechanism 33. Additionally, the top plate 5 does not necessarily have to be rotated when the chemical solution processing, the cleaning processing, and the dry processing are performed on the substrate 9.

In the substrate processing apparatus 1, the temperature of the processing liquid supplied to the substrate 9 during the cleaning processing (step S15) of the substrate 9 does not necessarily have to be changed. For example, the cleaning liquid may have approximately the same temperature from the start of supply to the substrate 9 to the end of the supply. In this case, the temperature of the cleaning liquid supplied to the substrate 9 may be higher than normal temperature, or may be less than or equal to normal temperature.

While in the above-described example, the chemical solution and the cleaning liquid are first processing liquids received by the first cup 41, and the substitutional liquid is a second processing liquid received by the second cup 42, the first processing liquid and the second processing liquid may be changed in various ways. The supply of the first processing liquid to the substrate 9 may be performed after the supply of the second processing liquid to the substrate 9.

For example, assuming that the substrate processing apparatus 1 uses a chemical solution and a cleaning liquid as processing liquids supplied to the substrate 9, a case is conceivable in which chemical solution processing of the substrate 9 is performed while the first cup 41 is at the first processing position, and then cleaning processing is performed after moving the first cup 41 to the second processing position. In this case, the chemical solution is a first processing liquid received by the first cup 41, and the cleaning liquid is a second processing liquid received by the second cup 42. A case is also conceivable in which chemical solution processing of the substrate 9 is performed while the first cup 41 is at the second processing position, and then cleaning processing is performed after moving the first cup 41 to the first processing position. In this case, the chemical solution is a second processing liquid received by the second cup 42, and the cleaning liquid is a first processing liquid received by the first cup 4. In either case, if the inner peripheral edge of the second-cup canopy part 422 opposes the outer peripheral surface of the opposing-member side wall part 512 in the radial direction and the second-cup gap distance D2 is greater than the holder gap distance D0 as described above, it is possible to suppress dispersion of the first processing liquid and the second processing liquid to the space above the cup part 4 and to receive a plurality of types of processing liquids separately by a plurality of cups.

The cup part 4 may include another cup arranged with the first cup 41 and the second cup 42 in the radial direction, in addition to the first cup 41 and the second cup 42. In other words, the cup part 4 may include three or more cups. In this case, the first cup 41 for receiving the aforementioned first processing liquid is one of the three or more cups other than the radially outermost cup, and the second cup 42 for receiving the second processing liquid is one of the three or more cups that is located radially outward of the first cup.

The first-cup gap distance D1, which is the distance in the radial direction between the inner peripheral edge of the first-cup canopy part 412 and the outer peripheral surface of the opposing-member side wall part 512, does not necessarily have to be greater than the holder gap distance D0, and may be less than or equal to the holder gap distance D0.

The lower surface of the first-cup canopy part 412 of the cup part 4 does not necessarily have to include the aforementioned inclined surface, and for example, approximately the entire lower surface of the first-cup canopy part 412 may be a flat surface generally perpendicular to the up-down direction. Similarly, the lower surface of the second-cup canopy part 422 does not necessarily have to include the aforementioned inclined surface, and for example, approximately the entire lower surface may be a flat surface generally perpendicular to the up-down direction.

In the substrate processing apparatus 1, in the state in which the top plate 5 is held by the substrate holder 31 and the processing space 90 is formed between the top plate 5 and the substrate holder 31, the lower end of the opposing-member side wall part 512 of the top plate 5 is located below the upper surface of the holder base 311 of the substrate holder 31 (i.e., below the upper end of the outer peripheral surface of the holder base 311). Thus, processing liquids dispersed from the lower end of the opposing-member side wall part 512 will be received if the inner peripheral edges of the first-cup canopy part 412 and the second-cup canopy part 422 are located above the lower end of the opposing-member side wall part 512 of the top plate 5. Accordingly, the processing liquids dispersed from the lower end of the opposing-member side wall part 512 will be received in a state in which the first-cup canopy part 412 and the second-cup canopy part 422 are located at positions lower than the substrate 9. As a result, the substrate 9 will be easily transferred between the substrate holder 31 and the mechanism for conveying the substrate 9 into and out of the housing 11, without moving the second cup 42 relative to the substrate holder 31.

The substrate processing apparatus 1 may include a second-cup moving mechanism for moving the second cup 42 relative to the substrate holder 31 in the up-down direction. In this case, the first cup 41 and the second cup 42 may be moved to positions below the positions illustrated in FIGS. 1 and 6 when the substrate 9 is transferred, i.e., when the substrate 9 is conveyed into or out of the substrate holder 31. This further facilitates the transfer of the substrate 9. As a result, the operational flexibility of the substrate processing apparatus 1 will be improved.

The configurations of the preferred embodiments and variations described above may be appropriately combined as long as there are no mutual inconsistencies.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2016-054965 filed in the Japan Patent Office on Mar. 18, 2016, the entire disclosure of which is incorporated herein by reference.

REFERENCE SIGNS LIST

1 Substrate processing apparatus
4 Cup part

5 Top plate
9 Substrate
31 Substrate holder
33 Substrate rotation mechanism
41 First cup
42 Second cup
43 Cup moving mechanism
54 Opposing-member opening
71 Processing liquid nozzle
72 Processing-liquid supply part
73 Gas supply part
81 First suction part
82 Second suction part
90 Processing space
91 Upper surface (of substrate)
411 First-cup side wall part
412 First-cup canopy part
421 Second-cup side wall part
422 Second-cup canopy part
511 Opposing-member canopy part
512 Opposing-member side wall part
721 Chemical-solution supply part
722 Cleaning-liquid supply part
723 Substitutional-liquid supply part
724 Temperature controller
D0 Holder gap distance
D1 First-cup gap distance
D2 Second-cup gap distance
J1 Central axis
S11 to S21 Step

The invention claimed is:

1. A substrate processing apparatus for processing a substrate, comprising:
a substrate holder of a disk-like shape having an outer diameter larger than an outer diameter of a substrate, disposed below said substrate, and for holding said substrate in a horizontal position;
a substrate rotation mechanism for rotating said substrate holder about a central axis pointing in an up-down direction;
an opposing member that opposes an upper surface of said substrate;
a processing-liquid supply part for supplying a processing liquid to said upper surface of said substrate;
a gas supply part for supplying a treatment atmospheric gas to a processing space that is a space between a lower surface of said opposing member and said upper surface of said substrate;
a cup part disposed around said substrate holder and for receiving said processing liquid from said substrate; and
a gas discharge part for discharging a gas in said cup part to an outside of said cup part by suction,
wherein said processing-liquid supply part includes:
a first processing-liquid supply part for supplying a first processing liquid to said substrate; and
a second processing-liquid supply part for supplying a second processing liquid to said substrate,
said opposing member includes:
an opposing-member canopy part that opposes said upper surface of said substrate; and
an opposing-member side wall part that extends downward from an outer peripheral portion of said opposing-member canopy part, and has an outer peripheral surface of a cylindrical shape and an inner peripheral surface that opposes an outer peripheral surface of said substrate holder in a radial direction,
said cup part includes:
a first cup having a first-cup side wall part of a cylindrical shape and a first-cup canopy part of a circular ring plate-like shape and for receiving said first processing liquid from said substrate, said first-cup canopy part extending radially inward from an upper edge of said first-cup side wall part;
a second cup having a second-cup side wall part of a cylindrical shape and a second-cup canopy part of a circular ring plate-like shape, disposed radially outward of said first cup, and for receiving said second processing liquid from said substrate, said second-cup canopy part extending radially inward from an upper edge of said second-cup side wall part and having an inner peripheral edge that opposes said outer peripheral surface of said opposing-member side wall part in the radial direction; and
a cup moving mechanism for moving said first cup relative to said substrate holder in the up-down direction,
said first processing liquid supplied to said upper surface of said substrate that is being rotated is received by said first cup while said first cup is at a first processing position at which an inner peripheral edge of said first-cup canopy part opposes said outer peripheral surface of said opposing-member side wall part in the radial direction,
said second processing liquid supplied to said upper surface of said substrate that is being rotated is received by said second cup while said first cup is at a second processing position at which said inner peripheral edge of said first-cup canopy part is located below a lower end of said opposing-member side wall part, and
a second-cup gap distance that is a distance in the radial direction between said outer peripheral surface of said opposing-member side wall part and said inner peripheral edge of said second-cup canopy part is greater than a holder gap distance that is a distance in the radial direction between said inner peripheral surface of said opposing-member side wall part and said outer peripheral surface of said substrate holder.

2. The substrate processing apparatus according to claim 1, wherein
a lower surface of said second-cup canopy part includes an inclined surface that is inclined downward outwardly in the radial direction from said inner peripheral edge of said second-cup canopy part.

3. The substrate processing apparatus according to claim 1, wherein
said opposing-member canopy part has an opposing-member opening in a central portion thereof,
said first processing liquid and said second processing liquid from said processing-liquid supply part are supplied through said opposing-member opening to said upper surface of said substrate, and
a first-cup gap distance that is a distance in the radial direction between said outer peripheral surface of said opposing-member side wall part and said inner peripheral edge of said first-cup canopy part is greater than said holder gap distance.

4. The substrate processing apparatus according to claim 1, wherein
a lower surface of said first-cup canopy part includes an inclined surface that is inclined downward outwardly in the radial direction from said inner peripheral edge of said first-cup canopy part.

5. The substrate processing apparatus according to claim 1, wherein
said opposing member rotates about said central axis when said substrate holder rotates.

6. The substrate processing apparatus according to claim 5, wherein
said opposing member is held by said substrate holder and rotated along with said substrate holder by said substrate rotation mechanism.

7. The substrate processing apparatus according to claim 1, wherein
said lower end of said opposing-member side wall part is located below an upper end of said outer peripheral surface of said substrate holder.

8. The substrate processing apparatus according to claim 1, wherein
said first processing liquid or said second processing liquid is a cleaning liquid that is supplied to said upper surface of said substrate at a processing temperature higher than normal temperature to perform cleaning processing on said substrate,
dry processing for removing a liquid from a surface of said substrate by rotating said substrate via said substrate rotation mechanism is performed after said cleaning processing ends, and
processing for cooling said substrate by supplying a processing liquid having a temperature lower than said processing temperature to said upper surface of said substrate is performed between said cleaning processing and said dry processing.

9. The substrate processing apparatus according to claim 3, wherein
a lower surface of said second-cup canopy part includes an inclined surface that is inclined downward outwardly in the radial direction from said inner peripheral edge of said second-cup canopy part.

10. The substrate processing apparatus according to claim 3, wherein
a lower surface of said first-cup canopy part includes an inclined surface that is inclined downward outwardly in the radial direction from said inner peripheral edge of said first-cup canopy part.

11. The substrate processing apparatus according to claim 3, wherein
said opposing member rotates about said central axis when said substrate holder rotates.

12. The substrate processing apparatus according to claim 11, wherein
said opposing member is held by said substrate holder and rotated along with said substrate holder by said substrate rotation mechanism.

13. The substrate processing apparatus according to claim 3, wherein
said lower end of said opposing-member side wall part is located below an upper end of said outer peripheral surface of said substrate holder.

14. The substrate processing apparatus according to claim 3, wherein
said first processing liquid or said second processing liquid is a cleaning liquid that is supplied to said upper surface of said substrate at a processing temperature higher than normal temperature to perform cleaning processing on said substrate,
dry processing for removing a liquid from a surface of said substrate by rotating said substrate via said substrate rotation mechanism is performed after said cleaning processing ends, and
processing for cooling said substrate by supplying a processing liquid having a temperature lower than said processing temperature to said upper surface of said substrate is performed between said cleaning processing and said dry processing.

15. The substrate processing apparatus according to claim 7, wherein
a lower surface of said second-cup canopy part includes an inclined surface that is inclined downward outwardly in the radial direction from said inner peripheral edge of said second-cup canopy part.

16. The substrate processing apparatus according to claim 7, wherein
a lower surface of said first-cup canopy part includes an inclined surface that is inclined downward outwardly in the radial direction from said inner peripheral edge of said first-cup canopy part.

17. The substrate processing apparatus according to claim 7, wherein
said opposing member rotates about said central axis when said substrate holder rotates.

18. The substrate processing apparatus according to claim 17, wherein
said opposing member is held by said substrate holder and rotated along with said substrate holder by said substrate rotation mechanism.

19. The substrate processing apparatus according to claim 7, wherein
said first processing liquid or said second processing liquid is a cleaning liquid that is supplied to said upper surface of said substrate at a processing temperature higher than normal temperature to perform cleaning processing on said substrate,
dry processing for removing a liquid from a surface of said substrate by rotating said substrate via said substrate rotation mechanism is performed after said cleaning processing ends, and
processing for cooling said substrate by supplying a processing liquid having a temperature lower than said processing temperature to said upper surface of said substrate is performed between said cleaning processing and said dry processing.

* * * * *